United States Patent
Diefenbeck et al.

(10) Patent No.: US 6,949,799 B2
(45) Date of Patent: Sep. 27, 2005

(54) SEMICONDUCTOR STRUCTURE COMPRISING AN ELECTROSTATIC DISCHARGE (ESD) PROTECTION DEVICE

(75) Inventors: Klaus Diefenbeck, Munich (DE); Klaus Gnannt, Stadtbergen (DE); Jakob Huber, Beyharting (DE); Ulrich Krumbein, Rosenheim (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/479,310
(22) PCT Filed: May 10, 2002
(86) PCT No.: PCT/EP02/05172
§ 371 (c)(1),
(2), (4) Date: Apr. 23, 2004
(87) PCT Pub. No.: WO02/097886
PCT Pub. Date: Dec. 5, 2002

(65) Prior Publication Data
US 2004/0169229 A1 Sep. 2, 2004

(30) Foreign Application Priority Data
May 31, 2001 (DE) ............................... 101 26 628

(51) Int. Cl.⁷ ............................................. H01L 23/62
(52) U.S. Cl. ..................... 257/355; 257/173; 257/362; 257/593
(58) Field of Search ................... 257/355, 173, 257/362, 593

(56) References Cited

U.S. PATENT DOCUMENTS

| 5,581,104 | A  | 12/1996 | Lowrey et al. ............. 257/355 |
| 6,232,822 | B1 | 5/2001  | Sakui et al. ................ 327/439 |
| 6,455,919 | B1 | 9/2002  | Brennan et al. ............ 257/616 |
| 6,680,493 | B1 | 1/2004  | Wolf et al. .................. 257/173 |

FOREIGN PATENT DOCUMENTS

| DE | 42 00 884 A1  | 7/1992 |
| DE | 100 02 241 A1 | 8/2001 |
| JP | 9-148338      | 6/1997 |
| JP | 10-172981     | 6/1998 |
| JP | 2000-58870    | 2/2000 |

OTHER PUBLICATIONS

Taur, Yuan, et al., "Fundamentals of Moden VLSI Devices", Cambridge University Press, 1998, pp. 320–325, (6 pages).
Betrand G. et al., "Analysis and Compact Modeling of a Vertical Grounded–Base NPN Bipolar Transistor used as an ESD Protection in a Smart Power Technology", IEEE BCTM 1,2, 2000, pp. 28–31, (4 pages).
Amerasekera A. et al., "ESD in Silicon Integrated Circuits", John Wiley & Sons, 1995, pp. 186–188, (3 pages).

*Primary Examiner*—David Nelms
*Assistant Examiner*—Tu-Tu Ho
(74) *Attorney, Agent, or Firm*—Maginot, Moore & Beck

(57) ABSTRACT

A semiconductor structure including a substrate, a device layer and a contact arranged on the substrate, comprises an ESD protective means, arranged between the substrate and the contact, such, that in the ESD case a breakthrough from the ESD protective means to the contact occurs.

8 Claims, 4 Drawing Sheets

SEMICONDUCTOR STRUCTURE COMPRISING AN ELECTROSTATIC DISCHARGE (ESD) PROTECTION DEVICE

This application is a national phase application under 35 U.S.C. § 371 of International Application No. PCT/EP02/05172, filed May 10, 2002, which claims benefits of Germany Application 101 26 628.6, filed May 31, 2001.

FIELD OF THE INVENTION

The present invention relates to a semiconductor structure having an ESD protection means and, in particular, to a bipolar transistor structure having an ESD proof base collector diode (ESD=electro static discharge).

DESCRIPTION OF PRIOR ART

With electronic devices, as they are manufactured and used today with ever smaller geometries with a simultaneous increase of integration density, there is a danger of damaging or destroying them in the case of electrostatic discharges due to the increasing sensibility. The devices are therefore to be protected against such electrostatic discharges, which may be achieved by handling them accordingly in protective zones, which however only prevents the entry of the electrostatic discharges without the devices showing any protective measures themselves.

As an example high-frequency transistors are regarded here, which are especially endangered by an electrostatic discharge (ESD) due to their low capacities. The problem with such high-frequency transistors is, that the request for good high-frequency properties and a robustness against an ESD overload are mainly contradictory.

Referring to FIG. 1 a high-frequency transistor known in the art is described in more detail in the following, as well as the problems occurring in the case of an ESD overload.

Usually, a high-frequency transistor consists of a parallel arrangement of several emitter- and base-fingers, wherein already one emitter finger and at least one base finger form a fully functional transistor. In FIG. 1 a transistor having an emitter finger and two base fingers is shown. Due to the given symmetry and for reasons of clarity it is sufficient to only regard one base cell of the transistor. The semiconductor structure includes a high-doped substrate 102 of an n-material. On the substrate a low-doped epitaxy layer 104 is grown. The substrate 102 forms a so-called "subcollector", which is electrically contacted from the back side to the outside, and the epitaxy layer 104 which is also formed of an n material forms the active collector.

In FIG. 1 a transistor is shown, wherein the collector is led out at the back through the substrate. The outer collector terminal (not illustrated here) is linked up via the back side of the semiconductor transistor chip via metallic layers. Such a construction is very common with discrete high-frequency transistors, while the collector terminal needs to be led out at the top with integrated transistors. A substrate of the contrary doped type is used herefore, and a high-doped layer, a so-called "buried layer" of the same doping type as the active collector is inserted. This "buried layer" is connected via a so-called "sinker diffusion" from above. The "buried layer" from IC technology has the same function as the substrate. The following embodiments also apply to an IC transistor.

In the epitaxy layer 104 a base area 106 is formed of a p-material. A base terminal 108 is associated to the base area 106. The base terminal 108 is formed in the layer 104 on both sides of the base area 106. In the base area 106 also an emitter area 110 is arranged, manufactured of an n-material. The emitter area 110 is formed in the base area 106, such, that it is completely formed in same, therefore spaced apart from the base terminal 108. By the emitter area 110, the base area 106, and the collector 104 an npn-transistor is formed.

The semiconductor structure 100 further includes base terminal lines 112. The base terminal lines 112 are arranged insulated from an epitaxy layer 104 having an insulating layer 104 on it. The insulating layer 114 can for example consist of a field oxide. One end of the base terminal lines 112 is connected to the base terminal 108. The other ends of the base terminal lines 112 are connected to a first base contact 116 and to a second base contact 118. The base contacts 116 and 118 are arranged on a planarizing layer 120, which is deposited above the epitaxy layer 104. The planarizing layer 120 is manufactured of an insulating material, and the base contacts 116 and 118 are electrically connected to the ends of the base terminal lines 112 via conductive structures 122.

The semiconductor structure 100 further includes an emitter terminal 124 connected to the emitter area 110. As it can be seen from FIG. 1, the emitter terminal 124 is at least partially arranged on an insulating layer 126. The insulating layer 126 covers the base terminal lines 112, so that the emitter terminal 124 is electrically insulated from the base terminal lines 112. The emitter terminal 124 is electrically separated from the base terminal 108 by insulating portions 128. The emitter terminal 124 is connected to an emitter contact 132 via a conductive structure 130 formed in the layer 120.

On the layer 120 a protective layer 134 is deposited, covering the emitter and base contacts as well as the exposed surfaces of the layer 120. Above the terminal line structures an insulating layer 136 is formed in the layer 120, as is indicated by dashed lines in FIG. 1.

With the npn-transistor shown in FIG. 1, the only possibility of an ESD protection is, that the arrangement is used in an ESD-secured environment, the semiconductor structure itself does not include any measures that would improve the ESD protection.

If, however, an ESD case occurs despite all safety precautions, i.e., if an electrostatic charging occurs over the semiconductor structure, very high currents flow across the loaded current path. Typical current densities here lie in the range of more than about $10^4$ A/cm$^2$. With such a high current density the collector base diode breaks, i.e., the npn-transition between the collector 104 and the base 106, and almost all the outer voltage is applied at the transition from the collector 104 to the subcollector 102, if the ESD loading is done over the collector base path and/or the collector emitter path. In this case the breakthrough field strength of the material of the collector and the subcollector is exceeded, and at this point an avalanche breakthrough occurs. In the case of an npn-transistor holes are injected into the emitter 110 using high energy, and electrons are drawn off into the subcollector 102.

As the current needs to flow on into the base contact 108 in an open emitter, which is a standard test condition when analyzing the base collector path, a secondary avalanche breakthrough occurs laterally at the transition between the emitter area 110 and the base 106, which usually leads to a destruction of the device.

In FIG. 1 the current paths occurring in the case of an electrostatic discharge are indicated for the respective transistors by the arrows 138 and 140.

FIG. 2 shows an enlarged portion of the semiconductor structure of FIG. 1 as the result of a simulation, that is from the middle of the emitter finger to the middle of the base finger. In FIG. 2, the hole current density in the ESD case in this area is illustrated. In the subcollector 102 the current is supported by electrons; therefore the hole current density lies in the range of about $10^{-4}$ A/cm$^2$. In the area of the epitaxy layer 104 the hole current density increases from the interface between the subcollector 102 and the epitaxy layer 104 based on a value of about $10^{-4}$ A/cm$^2$ to a value in the range of about $10^4$ A/cm$^2$, setting in the area below the insulation layer 114, in the area of the base terminal 108 and in the area below the emitter 110.

The area of the high hole current density of about $10^4$ A/cm$_2$ extends from this area below the emitter 110, the base terminal 108 and the layer 114 to the portion 142, wherein the hole current density decreases to about $10^2$ A/cm$^2$. The hole current density in the area between the area of the highest current density and the interface between the collector and the subcollector decreases from about $10^4$ A/cm$^2$ over $10^2$ A/cm$^2$, $10^0$ A/cm$^2$ and $10^{-2}$ A/cm$^2$ to the value in the collector of about $10^{-4}$ A/cm$^2$. A large portion of the hole diffuses into the emitter, recombines with the electrons there and then laterally flows off via the base contact after a secondary breakthrough.

The problem in the ESD case can easily be seen from FIG. 2, that is the high current density in the area below the emitter 110, which leads to the high load of the emitter 110, which in the end will lead to the destruction of the device due to the avalanche breakthrough of the npn-transition between the emitter 110 and the base 106.

The disadvantage of the known semiconductor structures is, that there is no method for improving the ESD strength of such structures, like e.g. of high-frequency transistors, as they were described referring to FIG. 1. The only existing possibility is to prevent areas of increased field strength which would locally lead to an earlier breakthrough and an increased current density, already in the design state and/or during process development. Despite such precautions the ESD strength of high-frequency transistors remains bad due to the necessity of optimizing a good high-frequency performance (HF performance) in general compared to NF transistors.

With design changes it further needs to be observed that these changes might result in undesired modifications of the electrical properties of the device produced in the semiconductor structure.

SUMMARY OF THE INVENTION

It is the object of the present invention to provide an improved semiconductor structure which is protected against an ESD overload and simultaneously does not affect the properties of the semiconductor structure.

In accordance with one aspect, the invention provides a semiconductor structure, having a substrate; a device layer arranged on the substrate and fanning a collector, wherein further a base and an emitter are formed in the device layer, and wherein the base has associated therewith a terminal contact area formed in the device layer; and one or more zones as ESD protective means, which are arranged between the substrate and the terminal contact area, wherein the one or more zones are formed outside an area which is opposite to the emitter and have a doping concentration higher than that in the substrate, such that in the ESD case a breakthrough occurs from the one or more zones to the terminal contact of the base.

The present invention is based on the findings that in the ESD case the current runs off outside of the sensitive areas of the semiconductor structure directly into the contact due to the sandwiching of the ESD protective means between the substrate and the contact. Along this path the cross sectional area available for the current is a lot larger compared to the cross sectional area of the current path through the sensitive areas of the semiconductor structure, so that damages will only occur with a significantly higher ESD load.

The advantage of the present invention is, that influencing the functionality of the semiconductor structure due to modifications of the residual structure is prevented due to the arrangement of the ESD protection means between the substrate and the contact, so that the electrical performance of the semiconductor structure is not affected.

According to a preferred embodiment of the present invention a path is illustrated, by which the ESD stability of high-frequency transistors, as it was described above referring to FIG. 1, is improved without the high-frequency properties of the transistor being affected, wherein here especially the ESD stability of the base collector diode is improved. Concerning this, the invention is based on the findings that the ESD strength of the collector base diode mainly depends on the profile course of the collector doping in the transmission area between the active collector and the subcollector.

In the preferred embodiment, the high-frequency transistor structure is modified at the transition from the collector to the subcollector, such, that in case of an overload the current preferably flows off only outside of the emitter directly into the base contact. Along this path the cross sectional area available to the current is a lot larger, so that a damage will only occur only with considerably higher ESD loads.

BRIEF DESCRIPTION OF THE DRAWINGS

In the following, preferred embodiments of the present invention are explained in more detail referring to the appended drawings, in which

In FIG. 3 a high-frequency bipolar transistor structure according to a preferred embodiment of the invention is shown in a cross sectional illustration. Elements and structures already described referring to FIG. 1 are designated with like reference numerals in FIG. 3, and a repeated description is omitted.

DESCRIPTION OF PREFERRED EMBODIMENTS

Figure 1:
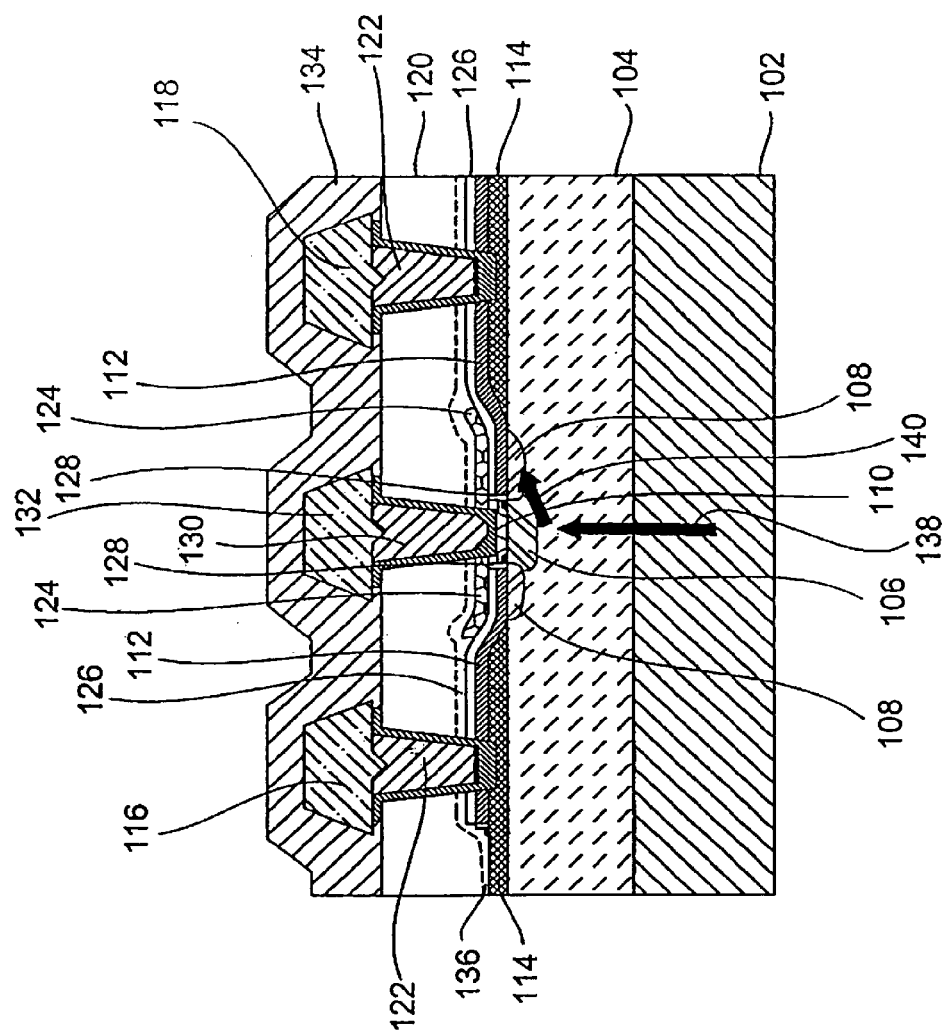
FIG. 1 shows a cross sectional view of a prior high-frequency bipolar transistor structure.
Figure 3:
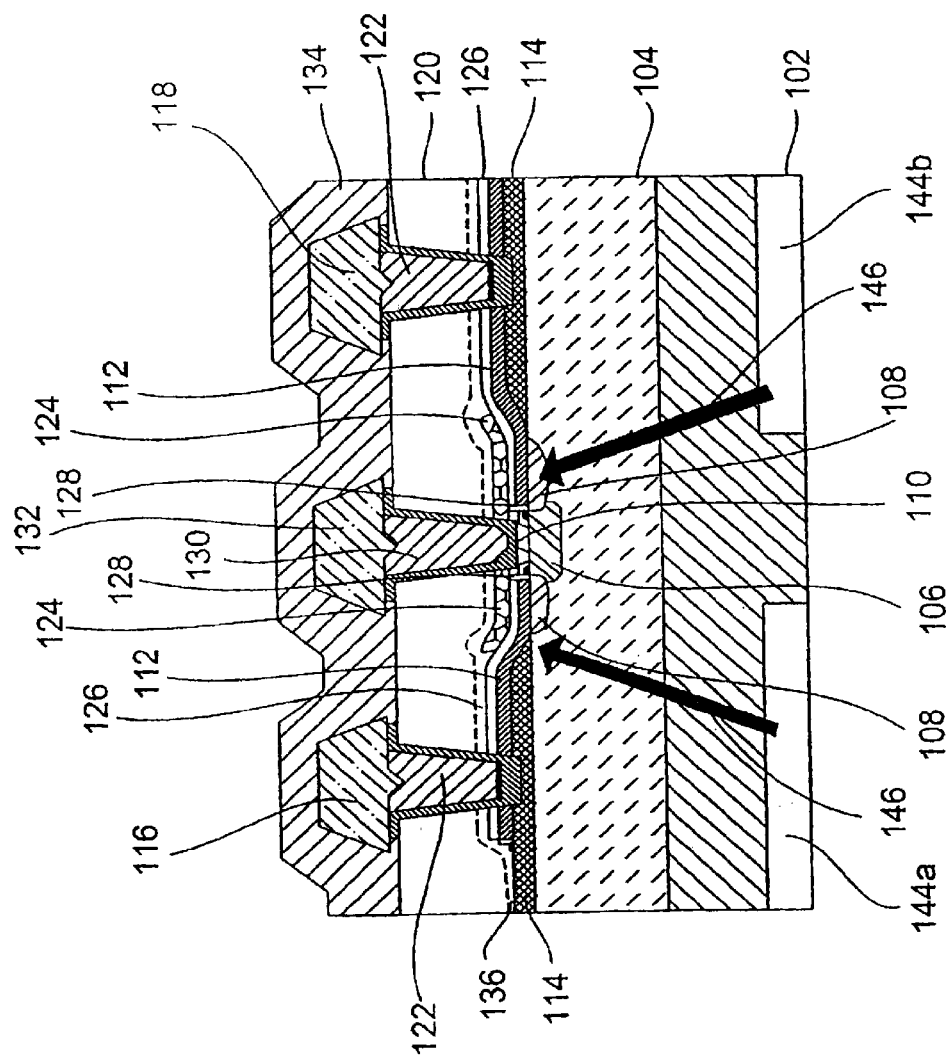
FIG. 3 shows a cross sectional view of a high-frequency bipolar transistor structure according to an embodiment of the present invention.

If the semiconductor structure illustrated in FIG. 3 is compared to the semiconductor structure illustrated in FIG. 1 according to the prior art, it can be seen that the inventive semiconductor structure comprises additional zones of increased doping 144a and 144b in the area of the interface between the subcollector 102 and the collector 104. The zones 144a and 144b are arranged such in the illustrated embodiment, that an area of the subcollector, which lies directly below an emitter finger, stays unchanged compared to a conventional semiconductor device, wherein the area outside the emitter finger is doped higher. The modification of the subcollector in the zones 144a and 144b can for example be carried out by a local implantation in the substrate 102 below the field oxide 114 with an own photo technique before the growing on of the epitaxy layer 104.

In the embodiment of the present invention shown in FIG. 3 the zones 144a and 144b have a doping density in the area of $5 \times 10^{18}$ atoms/cm$^3$ to $5 \times 10^{20}$ atoms/cm$^3$, wherein the zones are preferably doped with arsenic (As) atoms with a doping density of $5 \times 10^{19}$ atoms/cm$^3$.

The ESD strength of the semiconductor structure can only be improved by a specific setting of the dopant profile at the transition from the substrate 102 to the epitaxy layer 104, as hereby the field strength with a preset exterior voltage at the transition from the substrate 102 to the collector 104 may be influenced by the doping profile. If the doping of the subcollector 102 is specifically increased in the zones 144a and 144b, an increased field strength compared to the environment is set there. Thus, the avalanche breakthrough will occur earlier there and the current will then preferably flow off through these zones 144a and 144b. This way, the current path as it is schematically illustrated by the arrows 146 in FIG. 3, can specifically be directed into regions, wherein more area is available, which therefore comprise a larger cross sectional area, so that the current does less damage.

The zones 144a and 144b are arranged such, that they are spaced apart at a distance equal to the lateral extension of the base of the semiconductor structure shown in FIG. 3, which is formed of the base area 106 and the base terminal 108. In the ESD case the current is not led via the sensitive base areas 106 and the sensitive emitter areas 110 but from the subcollector 102 via zones 144a and 144b directly to the base terminal 108 (see arrow 146).

Although in FIG. 3 an example was described using an npn-transistor, it is obvious, that the inventive ESD protective means could also be used for pnp-transistors. It is further obvious, that the inventive ESD protective means may also be used for a transistor construction, wherein the collector terminal is drawn out at the top.

It is an advantage of the present invention, that no modifications of the devices formed in the semiconductor structure are necessary for improving the ESD protection, as the required modifications are carried out in the area of the substrate 102. Therefore also the signal properties of the produced semiconductor structure, in this case the high-frequency performance of the transistors, are not affected disadvantageously by the changes. Further, the creation of the zones can be embedded into existing production processes without problems.

Figure 2:
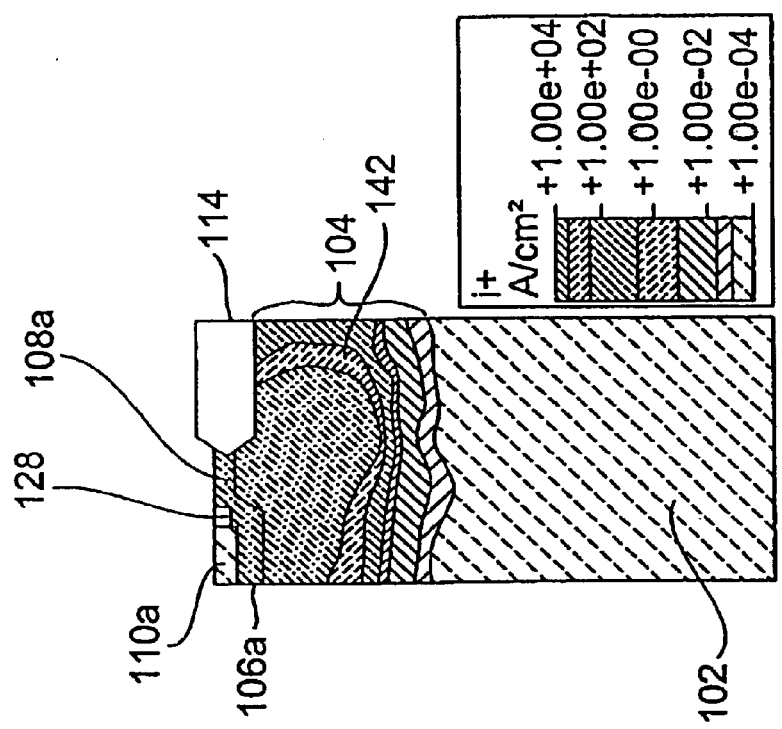
FIG. 2 shows a simulated illustration of the distribution of the hole current density in the environment of the base terminal of the high-frequency base transistor structure of FIG. 1 in the ESD case.
Figure 4:
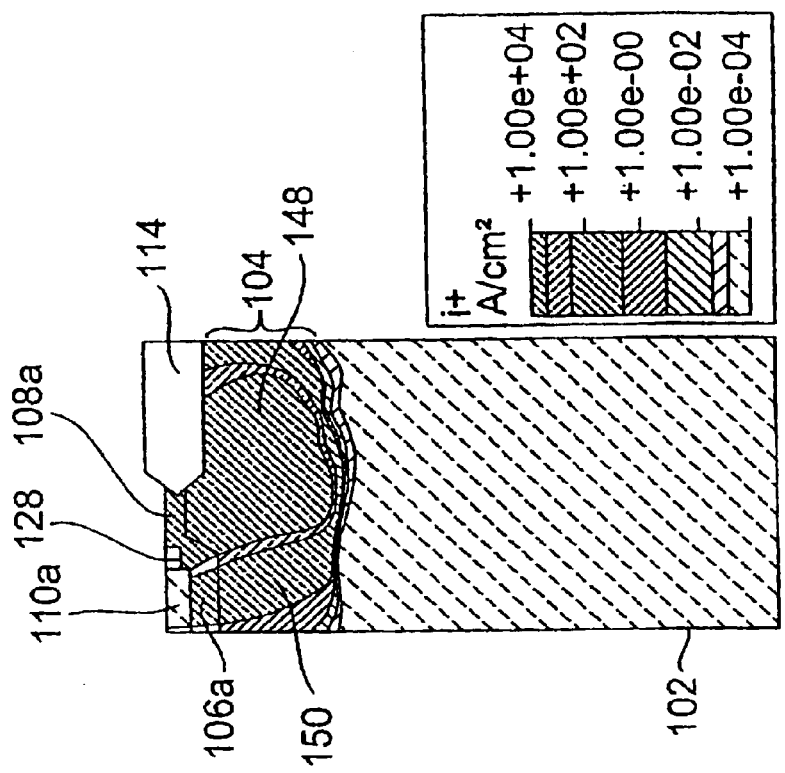
FIG. 4 shows a simulated illustration of the distribution of a hole current density in the environment of the base terminal of the high-frequency bipolar transistor structure of FIG. 3 in the ESD case.

Referring to FIG. 4, the effect of inserting the zones 144a and 144b on the current density the distribution is described in more detail, whereas here the area around the base terminal 108 of the transistor from FIG. 3 is regarded more closely, similar to FIG. 2.

In the area of the substrate and/or the subcollector 102 the hole current density in the ESD case is about $10^{-4}$ A/cm$^2$. Similar to FIG. 2 the hole current density increases based on the interface between the subcollector 102 and the collector 104 from a value of about $10^{-4}$ A/cm$^2$ to a maximum value of about $10^4$ A/cm$^2$. The high current density is mainly restricted to an area 148 below the base terminal 108 and the field oxide layer 114. On the base of the area 148 with the highest hole density, the current density decreases over the values $10^2$ A/cm$^2$, $10^0$ A/cm$^2$, $10^{-2}$ A/cm$^2$, to about $10^{-4}$ A/cm$^2$ in the area of the interface between the subcollector 102 and the collector 104. An area 150 directly below the emitter 110 and the base area 106 comprises a significantly lower hole current density than the areas lying below the terminal 108, wherein the hole current density hereby lies at about $10^2$ A/cm$^2$ compared to a hole current density which lies at about $10^4$ A/cm$^2$ with conventional transistors in the same area.

From FIGS. 2 and 4 the current density of the hole current can be seen, and with the modified subcollector the larger part of the current flows directly to the base terminal area 108 and the emitter is only slightly loaded. In FIG. 4 the improvement can clearly be seen, which is obtainable in contrast to conventional semiconductor structures by the inventive ESD protective means.

It is noted that the present invention is not limited to the embodiment described referring to FIG. 3 and FIG. 4. The present invention generally refers to semiconductor structures which comprise an ESD protective means in the area of the substrate apart from a substrate and a device, which cause a breakthrough from the substrate to an intended contact in the ESD case, so that the ESD sensitive area and/or areas in the semiconductor structure sensitive against high currents are "bypassed", i.e., the excess current is led past these areas and directly into the contact.

Further, the present invention is not restricted to the embodiment of the ESD protective means shown in FIG. 3. Instead of the high-doped zones in the substrate shown there, they can also be arranged in the epitaxy layer or in the substrate or in an interlayer arranged between the substrate and the epitaxy layer 104. Instead of the high-doped zones, the ESD protective means may also be formed by areas with another semiconductor material. The present invention is further not restricted to the area of bipolar transistors but relates in general to semiconductor structures, where a current is lead past the sensitive areas in case of a breakthrough, like e.g. diodes or similar things.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

List of Reference Numerals 102 substrate
104 epitaxy layer
106 base area
108 base terminal
110 emitter area
112 base terminal line
114 insulating layer
116 base contact
118 common base contact
120 planarizing layer
122 conductive structures
124 emitter terminal
126 insulating layer 128 insulating portion
130 conductive structure
132 emitter contact
134 protective layer
136 insulating layer
138 arrow
140 arrow
142 area of medium current density
144a, 144b zone with high doping
146 arrow
148 area with high current density
150 area with medium current density

What is claimed is:

1. A semiconductor structure, comprising a substrate;

a device layer arranged on the substrate and forming a collector, wherein further a base and an emitter are formed in the device layer, and wherein the base has associated therewith a terminal contact area formed in the device layer; and one or more zones an ESD protective means, which are arranged between the substrate and the terminal contact area, wherein the one or more zones are formed outside an area which is opposite to the emitter and have a doping concentration higher than that in the substrate, such that in the ESD case a breakthrough occurs from the one or more zones to the terminal contact of the base.

2. The semiconductor structure according to the claim 1, wherein a subcollector is formed in the substrate, and wherein the one or more zones are formed in the subcollector, in the collector or between the subcollector and the collector and have a doping concentration which is higher than the doping concentration in the subcollector.

3. The semiconductor structure according claim 1, wherein the one or more zones are arranged outside an area which is opposite an area determined by the base and the terminal contact of the base.

4. The semiconductor structure according the claim 2, wherein the doping profile of the one or more zones falls steeper towards the device layer than in the area of the subcollector, wherein the device layer is an epitaxy layer.

5. The semiconductor structure according to claim 2, wherein the doping profile of the one or more zones extends further into the collector than the doping profile of the subcollector.

6. The semiconductor structure according to claim 2, wherein the one or more zones are formed in an interlayer arranged between the collector and the subcollector.

7. The semiconductor structure according to claim 1, wherein the one or more zones have a doping concentration in the range of $5 \times 10^{18}$ atom/cm$^3$ to $5 \times 10^{20}$ atoms/cm$^3$.

8. The semiconductor structure according to claim 1, wherein the one or more zones are produced from a semiconductor material having a low breakthrough field strength.

* * * * *